United States Patent
Youn et al.

(10) Patent No.: US 12,058,909 B2
(45) Date of Patent: Aug. 6, 2024

(54) DISPLAY DEVICE WITH SIGNAL LINE OVERLAPPING GATE DRIVING CIRCUIT

(71) Applicant: LG DISPLAY CO., LTD., Seoul (KR)

(72) Inventors: Jae-Woong Youn, Paju-si (KR); Kiwon Son, Paju-si (KR); Minseon Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 353 days.

(21) Appl. No.: 17/517,394

(22) Filed: Nov. 2, 2021

(65) Prior Publication Data

US 2022/0181431 A1 Jun. 9, 2022

(30) Foreign Application Priority Data

Dec. 4, 2020 (KR) .......................... 10-2020-0168218

(51) Int. Cl.
| | |
|---|---|
| *H10K 59/131* | (2023.01) |
| *G09G 3/3225* | (2016.01) |
| *H10K 59/122* | (2023.01) |

(52) U.S. Cl.
CPC ....... *H10K 59/1315* (2023.02); *G09G 3/3225* (2013.01); *H10K 59/122* (2023.02); *G09G 2310/0264* (2013.01)

(58) Field of Classification Search
CPC ............ H10K 59/1315; H10K 59/122; G09G 3/3225; G09G 2310/0264
USPC ........................................................ 257/40
See application file for complete search history.

(56) References Cited

U.S. PATENT DOCUMENTS

2020/0212159 A1* 7/2020 Lee ...................... H10K 59/131

* cited by examiner

*Primary Examiner* — Xia L Cross
(74) *Attorney, Agent, or Firm* — Birch, Stewart, Kolasch & Birch, LLP

(57) ABSTRACT

Embodiments of the present disclosure are related to a display device, as disposing a clock signal line on an area overlapping with an area where a gate circuit is disposed on a non-active area of a display panel, a gate driving circuit can be disposed on the non-active area while minimizing an increase of the non-active area. Furthermore, as disposing the clock signal line by using metal layers that a first metal layer with a low resistance and a second metal layer with a high reflectance are stacked, the clock signal line disposed on the non-active area and a pixel electrode disposed on an active area can be implemented as a same layer, the clock signal line disposed on the gate circuit can be implemented while reducing the number of masks.

23 Claims, 9 Drawing Sheets

DISPLAY DEVICE WITH SIGNAL LINE OVERLAPPING GATE DRIVING CIRCUIT

CROSS REFERENCE TO RELATED APPLICATION

This application claims priority to Korean Patent Application No. 10-2020-0168218, filed on Dec. 4, 2020, the entire contents of which is hereby expressly incorporated by reference for all purposes as if fully set forth herein into the present application.

BACKGROUND OF THE DISCLOSURE

Field

Embodiments of the present disclosure are related to a display device.

Description of Related Art

The growth of the information society leads to increased demand for display devices to display images and use of various types of display devices, such as liquid crystal display devices, organic light emitting display devices, etc. The display device can include a display panel where a plurality of gate lines, a plurality of data lines and a plurality of subpixels are disposed, and various driving circuit for driving the display panel. The display device can include a gate driving circuit for driving the plurality of gate lines, a data driving circuit for driving the plurality of data lines and a controller for controlling the gate driving circuit and the data driving circuit.

The driving circuit included in the display device, for example, can be mounted on a film such as a flexible printed circuit. The driving circuit can be electrically connected to the display panel as the film is bonded on a bezel area of the display panel.

Alternatively, the driving circuit can be formed on the bezel area of the display panel directly.

The driving circuit can be implemented easily through a manufacture process of the display panel by forming the driving circuit on the bezel area, but there may be a limitation that the bezel area of the display panel can be increased due to an arrangement of the driving circuit and necessary lines.

SUMMARY OF THE EMBODIMENTS

Embodiments of the present disclosure provide methods being capable of disposing a driving circuit on a non-active area of a display panel while minimizing an increase of the non-active area of the display panel.

Embodiments of the present disclosure provide methods being capable of arranging a driving circuit and a signal line on a non-active area of a display panel without an increase of the number of masks and reducing a parasitic capacitance between the driving circuit and the signal line.

Embodiments of the present disclosure provide a display device including a plurality of pixel electrodes located on each of a plurality of subpixels disposed on an active area, a gate driving circuit disposed on a non-active area located outside of the active area and outputting a scan signal to the plurality of subpixels, and one or more signal lines disposed on the non-active area and disposed on a same layer as a layer where the plurality of pixel electrodes are disposed, and supplying a signal to the gate driving circuit.

The one or more signal lines can be located on the gate driving circuit.

At least a portion of the one or more signal lines can be located on an area overlapping with the gate driving circuit.

The one or more signal lines can be made of a same material as the plurality of pixel electrodes.

Each of the one or more signal lines and the plurality of pixel electrodes can include two or more metal layers.

The one or more signal lines can include a first metal layer having a first resistance and a first reflectance, and a second metal layer disposed on the first metal layer and having a second resistance greater than the first resistance and having a second reflectance greater than the first reflectance.

Embodiments of the present disclosure provide a display device including a plurality of gate lines disposed on an active area, a gate driving circuit disposed on a non-active area located outside of the active area, and outputting a scan signal to the plurality of gate lines, and one or more signal lines located on the gate driving circuit, supplying a signal to the gate driving circuit, and at least partially located on an area overlapping with the gate driving circuit.

Embodiments of the present disclosure provide a display device including a display panel where the a plurality of gate lines, a plurality of data lines and a plurality of subpixels are disposed, a gate driving circuit outputting a scan signal to the plurality of gate lines, one or more signal lines located on the gate driving circuit, and supplying a signal to the gate driving circuit, and a plurality of pixel electrodes located on each of the plurality of subpixels, and disposed on a same layer as a layer where the one or more signal lines are disposed, and comprising a first metal layer having a first reflectance and a second metal layer located on the first metal layer and having a second reflectance greater than the first reflectance.

According to various embodiments of the present disclosure, by disposing a line supplying a signal or a voltage to a gate driving circuit such as a clock signal line on the gate driving circuit, the gate driving circuit can be disposed while minimizing an increase of a non-active area of a display panel.

According to various embodiments of the present disclosure, by disposing a clock signal line by using a metal layer disposed on a same layer as a layer where a pixel electrode is disposed, the clock signal line can be disposed without increasing the number of masks. Furthermore, as a planarization layer located under the pixel electrode is disposed between the clock signal line and the gate driving circuit, it can be prevented that a parasitic capacitance between the clock signal line and the gate driving circuit is formed.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION OF THE EMBODIMENTS

Figure 1:
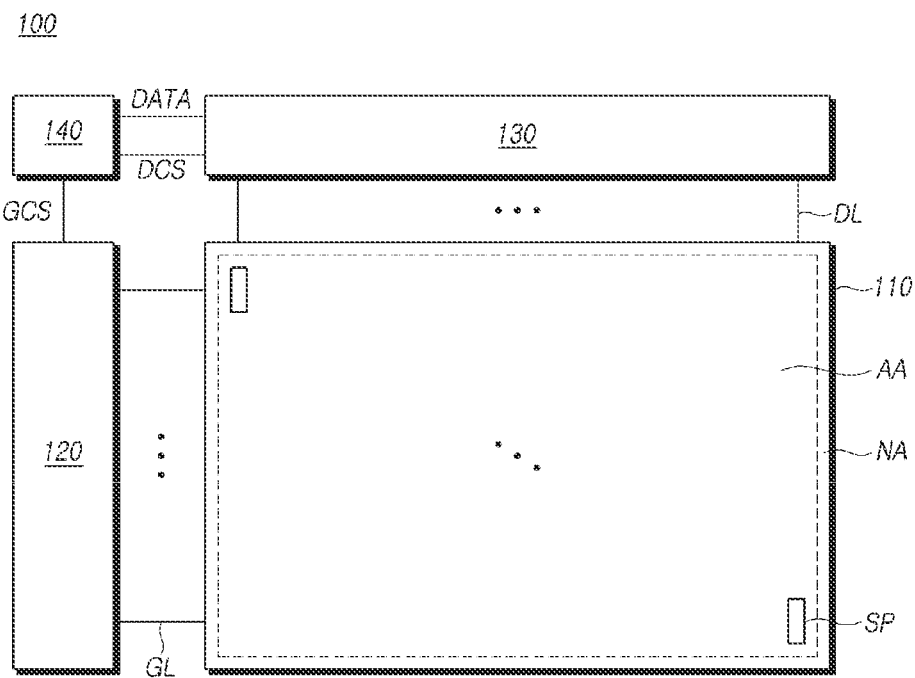
FIG. 1 is a diagram schematically illustrating a configuration of a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein may be omitted or may be provided briefly when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a diagram schematically illustrating a configuration of a display device 100 according to embodiments of the present disclosure. All the components of the display device 100 according to all embodiments of the present disclosure are operatively coupled and configured.

Referring to FIG. 1, the display device 100 can include a display panel 110, and a gate driving circuit 120, a data driving circuit 130 and a controller 140 for driving the display panel 110.

The display panel 110 can include an active area AA where a plurality of subpixels SP is disposed, and a non-active area which is located outside the active area AA.

A plurality of gate lines GL and a plurality of data lines DL can be arranged on the display panel 110. The plurality of subpixels SP can be located in areas where the gate lines GL and the data lines DL intersect each other.

The gate driving circuit 120 is controlled by the controller 140, and sequentially outputs scan signals to the plurality of gate lines GL arranged on the display panel 110, thereby controlling the driving timing of the plurality of subpixels SP.

The gate driving circuit 120 can include one or more gate driver integrated circuits GDIC, and can be located only at one side of the display panel 110, or can be located at both sides thereof according to a driving method.

Each gate driver integrated circuit GDIC can be connected to a bonding pad of the display panel 110 by a tape automated bonding TAB method or a chip-on-glass COG method. Alternatively, each gate driver integrated circuit GDIC can be implemented by a gate-in-panel GIP method to then be directly arranged on the display panel 110. In some cases, the gate driver integrated circuit GDIC can be integrated and arranged on the display panel 110. In addition, each gate driver integrated circuit GDIC can be implemented by a chip-on-film COF method in which an element is mounted on a film connected to the display panel 110.

The data driving circuit 130 receives image data from the controller 140 and converts the image data into an analog data voltage Vdata. Then, the data driving circuit 130 outputs the data voltage Vdata to each data line DL according to the timing at which the scan signal is applied through the gate line GL so that each of the plurality of subpixels SP emits light having brightness according to the image data.

The data driving circuit 130 can include one or more source driver integrated circuits SDIC.

Each source driver integrated circuit SDIC can include a shift register, a latch circuit, a digital-to-analog converter, an output buffer, and the like.

Each source driver integrated circuit SDIC can be connected to a bonding pad of the display panel 110 by a tape automated bonding TAB method or a chip-on-glass COG method. Alternatively, each source driver integrated circuit SDIC can be directly disposed on the display panel 110. Alternatively, in some cases, the source driver integrated circuit SDIC can be integrated and arranged on the display panel 110. In addition, each source driver integrated circuit SDIC can be implemented by a chip-on-film COF method. In this case, each source driver integrated circuit SDIC can be mounted on a film connected to the display panel 110, and can be electrically connected to the display panel 110 through wires on the film.

The controller 140 supplies various control signals to the gate driving circuit 120 and the data driving circuit 130, and controls the operation of the gate driving circuit 120 and the data driving circuit 130.

The controller 140 can be mounted on a printed circuit board, a flexible printed circuit, or the like, and can be electrically connected to the gate driving circuit 120 and the data driving circuit 130 through the printed circuit board, the flexible printed circuit, or the like.

The controller 140 allows the gate driving circuit 120 to output the scan signal according to the timing implemented in each frame, and converts a data signal received from the outside to conform to the data signal format used in the data driving circuit 130 and then outputs the converted image data to the data driving circuit 130.

The controller 140 receives, from the outside (e.g., a host system), various timing signals including a vertical synchronization signal VSYNC, a horizontal synchronization signal HSYNC, an input data enable DE signal, a clock signal CLK, and the like, as well as the image data.

The controller 140 can generate various control signals using various timing signals received from the outside, and can output the control signals to the gate driving circuit 120 and the data driving circuit 130.

For example, in order to control the gate driving circuit 120, the controller 140 outputs various gate control signals GCS including a gate start pulse GSP, a gate shift clock GSC, a gate output enable signal GOE, or the like.

The gate start pulse GSP controls operation start timing of one or more gate driver integrated circuits GDIC constituting the gate driving circuit 120. The gate shift clock GSC, which is a clock signal commonly input to one or more gate driver integrated circuits GDIC, controls the shift timing of the scan signal. The gate output enable signal GOE specifies timing information on one or more gate driver integrated circuits GDIC.

In addition, in order to control the data driving circuit 130, the controller 140 outputs various data control signals DCS including a source start pulse SSP, a source sampling clock SSC, a source output enable signal SOE, or the like.

The source start pulse SSP controls a data sampling start timing of one or more source driver integrated circuits SDIC constituting the data driving circuit 130. The source sampling clock SSC is a clock signal for controlling the timing of sampling data in the respective source driver integrated circuits SDIC. The source output enable signal SOE controls the output timing of the data driving circuit 130.

The display device 100 can further include a power management integrated circuit for supplying various voltages or currents to the display panel 110, the gate driving circuit 120, the data driving circuit 130, and the like or controlling various voltages or currents to be supplied thereto.

Each of the plurality of subpixels SP can be an area defined by the intersection of the gate line GL and the data line DL, and a liquid crystal or a light-emitting element can be disposed therein depending on the type of the display device 100.

For example, in the case that the display device 100 is a liquid crystal display device, the display panel 110 can include a liquid crystal layer. And by controlling an arrangement of a liquid crystal according to a field made by each of the plurality of subpixels SP, a brightness of the subpixel SP can be controlled and an image can be displayed.

For another example, in the case that the display device 100 is an organic light-emitting display device, an organic light-emitting diode OLED and various circuit elements can be disposed on the plurality of subpixels SP. By controlling a current supplied to the organic light-emitting diode OLED disposed on the subpixel SP by the various circuit elements, each subpixel SP can represent a brightness corresponding to an image data.

Alternatively, in some cases, a light-emitting diode LED or a micro light-emitting diode μLED can be disposed on the subpixel SP.

Figure 2:
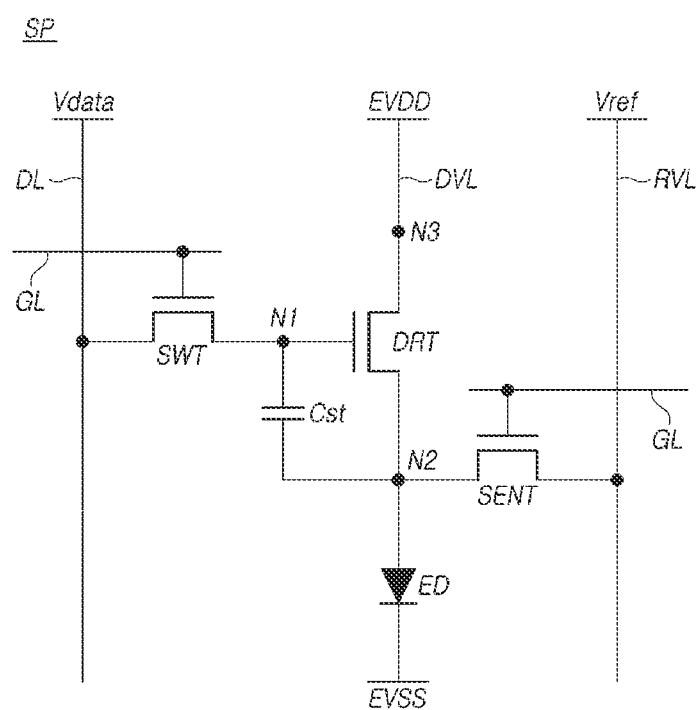
FIG. 2 is a diagram illustrating an example of a circuit structure of a subpixel included in a display device according to embodiments of the present disclosure.

FIG. 2 is a diagram illustrating an example of a circuit structure of the subpixel SP included in the display device 100 according to embodiments of the present disclosure.

Particularly, FIG. 2 illustrates an example of a circuit structure of the subpixel SP in the case that the display device 100 is an organic light-emitting display device, but embodiments of the present disclosure can be applied to other types of display devices.

Referring to FIG. 2, a light-emitting element ED and a driving transistor DRT for driving the light-emitting element ED can be disposed on the subpixel SP. Furthermore, at least one circuit element other than the light-emitting element ED and the driving transistor DRT can be further disposed on the subpixel SP.

As an example illustrated in FIG. 2, a switching transistor SWT, a sensing transistor SENT and a storage capacitor Cst can be further disposed on the subpixel SP.

Thus, an example shown in FIG. 2 illustrates a 3T1C structure that three thin film transistors and one capacitor other than the light-emitting element ED are disposed on the subpixel SP as an example, but embodiments of the present disclosure are not limited to this. Furthermore, the example shown in FIG. 2 illustrates a case that all thin film transistors are N type; however, in some cases, one or more thin film transistors disposed on the subpixels SP can be P type.

The switching transistor SWT can be electrically connected between the data line DL and a first node N1.

The data voltage Vdata can be supplied to the subpixel SP through the data line DL. The first node N1 can be a gate node of the driving transistor DRT.

The switching transistor SWT can be controlled by the scan signal supplied to the gate line GL. The switching transistor SWT can control that the data voltage Vdata supplied through the data line DL is applied to the gate node of the driving transistor DRT.

The driving transistor DRT can be electrically connected between a driving voltage line DVL and the light-emitting element ED.

A light-emitting high potential driving voltage EVDD can be supplied to a third node N3 through the driving voltage line DVL. The third node N3 can be a drain node or a source node of the driving transistor DRT.

The driving transistor DRT can be controlled by a voltage applied to the first node N1. And the driving transistor DRT can control a driving current supplied to the light-emitting element ED.

The sensing transistor SENT can be electrically connected between a reference voltage line RVL and a second node N2.

A reference voltage Vref can be supplied to the second node N2 through the reference voltage line RVL. The second node N2 can be a source node or a drain node of the driving transistor DRT.

The sensing transistor SENT can be controlled by the scan signal supplied to the gate line GL. The gate line controlling the sensing transistor SENT can be same as the gate line GL controlling the switching transistor SWT, or can be different.

The sensing transistor SENT can control that the reference voltage Vref is applied to the second node N2. Furthermore, the sensing transistor SENT, in some cases, can control to sense a voltage of the second node N2 through the reference voltage line RVL.

The storage capacitor Cst can be electrically connected between the first node N1 and the second node N2. The storage capacitor Cst can maintain the data voltage Vdata applied to the first node N1 during one frame.

The light-emitting element ED can be electrically connected between the second node N2 and a line supplied with a light-emitting low potential driving voltage EVSS.

When the scan signal of a turned-on level is applied to the gate line GL, the switching transistor SWT and the sensing transistor SENT can be turned-on. The data voltage Vdata can be applied to the first node N1, and the reference voltage Vref can be applied to the second node N2.

According to a voltage difference between a voltage of the first node N1 and a voltage of the second node N2, a driving current supplied to the driving transistor DRT can be determined.

The light-emitting element ED can represent a luminance according to a driving current supplied through the driving transistor DRT.

As described above, the subpixel SP can be controlled by the scan signal supplied through the gate line GL, and represent a luminance according to an image data.

The scan signal can be supplied from the gate driving circuit 120. The gate driving circuit 120 can be disposed on the non-active area NA of the display panel 110.

Figure 3:
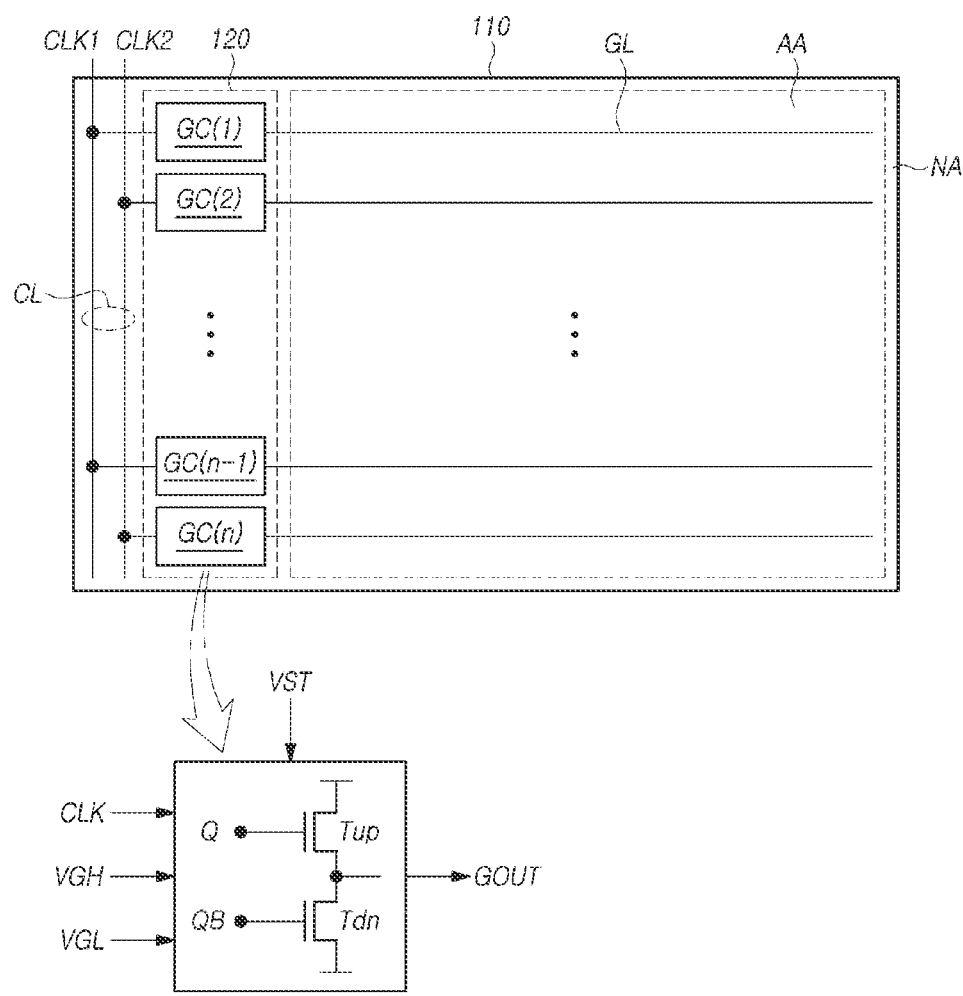
FIG. 3 is a diagram schematically illustrating an example of a structure of a gate driving circuit included in a display device according to embodiments of the present disclosure is disposed.

FIG. 3 is a diagram schematically illustrating an example of a structure of the gate driving circuit 120 included in the display device 100 according to embodiments of the present disclosure is disposed.

Referring to FIG. 3, the gate driving circuit 120 can be disposed on at least one side of the display panel 110. The gate driving circuit 120 can be disposed on the non-active area NA of the display panel 110.

The gate driving circuit 120 can include a plurality of gate circuits GC driving each of the plurality of gate lines GL.

Each of the plurality of gate circuits GC can output the scan signal to each of the plurality of gate lines GL. In some cases, one gate circuit GC can output the scan signal to several gate lines GL.

Each of the plurality of gate circuits GC can include various circuit element controlling an output of the scan signal.

For example, each of the plurality of gate circuits GC can include a pull-up transistor Tup controlling an output of the scan signal of the turned-on level. Each of the plurality of gate circuits GC can include a pull-down transistor Tdn controlling an output of the scan signal of a turned-off level.

The pull-up transistor Tup can be controlled by a voltage level of a Q node. The pull-down transistor Tdn can be controlled by a voltage level of a QB node.

Each of the plurality of gate circuits GC can include a plurality of thin film transistor for controlling the voltage level of the Q node and the voltage level of the QB node. Furthermore, each of the gate circuits GC can include at least one capacitor.

The gate circuit GC can be input a signal such as a gate start signal VST and a clock signal CLK controlling a driving timing of the gate circuit GC from outside. The gate start signal VST can be a carry signal output from other gate circuit GC.

The gate circuit GC can be input various voltages such as a gate high voltage VGH and a gate low voltage VGL used for an output of the scan signal. In some cases, the gate circuit GC can output the scan signal using the clock signal CLK.

At least one line supplying a signal or a voltage to the gate circuit GC can be disposed on the non-active area NA of the display panel 110.

For example, a plurality of clock signal line CL can be disposed on the non-active area NA of the display panel 110. FIG. 3 illustrates an example that the clock signal line CL supplying two clock signals CLK such as a first clock signal CLK1 and a second clock signal CLK2 is disposed, but the clock signal line CL, in some cases, can be disposed more such as four, eight or the like.

Furthermore, a line supplying the gate high voltage VGH and a line supplying the gate low voltage VGL can be disposed on the non-active area NA of the display panel 110.

Thus, by disposing the gate driving circuit 120 on the non-active area NA of the display panel 110, the gate driving circuit 120 can be implemented easily, but the non-active area NA of the display panel 110 can be increased.

Embodiments of the present disclosure provide methods being capable of disposing the gate driving circuit 120 on the non-active area NA of the display panel 110 while minimizing an increase of the non-active area NA of the display panel 110.

Figure 4:
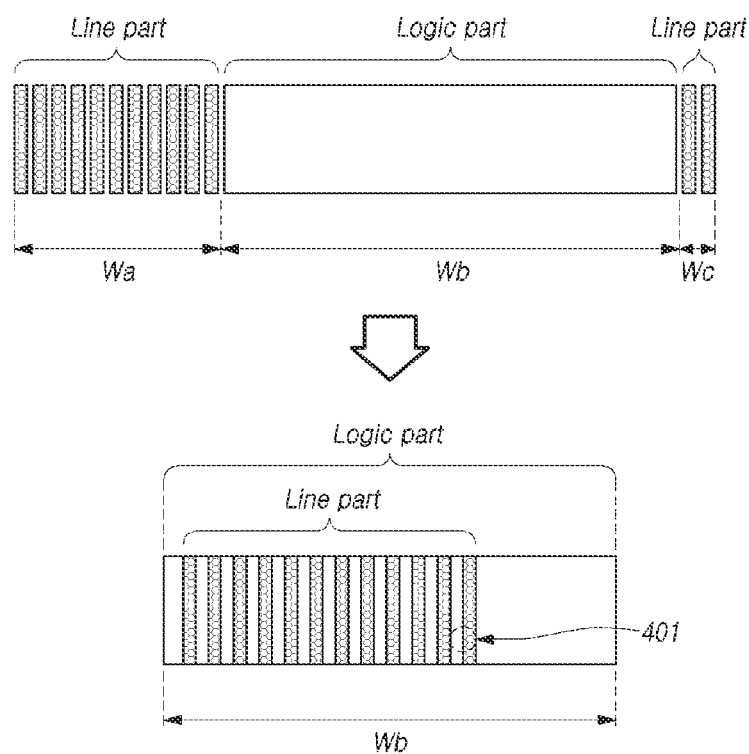
FIG. 4 is a diagram schematically illustrating another example of a structure of a gate driving circuit included in a display device according to embodiments of the present disclosure is disposed.

FIG. 4 is a diagram schematically illustrating another example of a structure of the gate driving circuit 120 included in the display device 100 according to embodiments of the present disclosure is disposed.

Referring to FIG. 4, for implementing the gate driving circuit 120 on the non-active area NA of the display panel 110, a logic part and a line part can be disposed on the non-active area NA.

The logic part can mean the gate circuit GC included in the gate driving circuit 120 and outputting the scan signal to the gate line GL. In the logic part, a plurality of thin film transistors and at least one capacitor for controlling an output of the scan signal can be disposed.

The line part can mean a line supplying various signals which is necessary for driving of the gate circuit GC to the gate circuit GC. The line part can include the clock signal line CL supplying the clock signal CLK, a voltage line supplying the gate high voltage VGH and a voltage line supplying the gate low voltage VGL or the like.

In the case that the logic part and the line part are disposed on different areas on the non-active area NA of the display panel 110, the non-active area NA can increase.

Embodiments of the present disclosure provide methods being capable of disposing the gate driving circuit 120 on the non-active area NA of the display panel 110 while reducing an increase of the non-active area NA, by providing the display device 100 which the line part is disposed on an area where the logic part is disposed.

For example, the logic part including a plurality of thin film transistor can be disposed on the non-active area NA of the display panel 110.

The line part supplying a signal to the logic part can be disposed on an area where the logic part is disposed. At least a portion of the line part can be disposed on an area overlapping with an area where the logic part is disposed.

The line part, such as described above, can include the clock signal line CL, a voltage line supplying the gate high voltage VGH or the gate low voltage VGL. Furthermore, the line part can include a line supplying a signal or a voltage necessary for driving of the logic part to the logic part other than above mentioned lines.

As the line part is disposed on an area where the logic part is disposed, widths Wa, Wc which is required for an arrangement of the ling part can be reduced in the non-active area NA of the display panel 110.

As the non-active area NA of the display panel 110 secure a width Wb which is required for an arrangement of the logic part, the logic part and the line part for the gate driving circuit 120 can be disposed on the non-active area NA.

Thus, the gate driving circuit 120 for driving of the gate line GL can be disposed on the non-active area NA of the display panel 110 while minimizing an increase of the non-active area NA of the display panel 110.

The line part can be electrically connected to a thin film transistor included in the logic part through a contact hole formed in at least one insulating layer located between the line part and the logic part.

Figure 5:
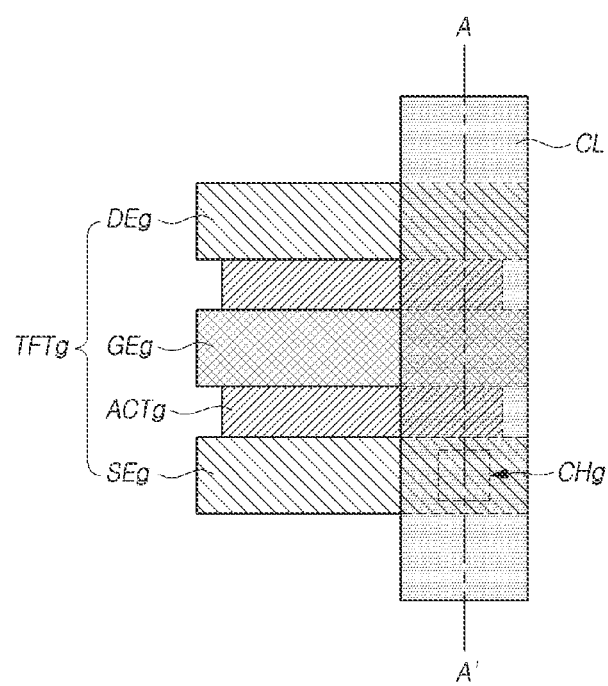
FIG. 5 is a diagram illustrating an example of an enlarged structure of an area 401 shown in FIG. 4.

FIG. 5 is a diagram illustrating an example of an enlarged structure of an area 401 shown in FIG. 4.

Referring to FIG. 5, a gate circuit thin film transistor TFTg means a thin film transistor disposed in the gate circuit GC corresponding to the logic part of the gate driving circuit 120. FIG. 5 illustrates an example that the clock signal line CL among various lines included in the line part disposed on the logic part is disposed, but as described above, a line disposed on the logic part can include all lines supplying a signal or a voltage to the logic part.

The gate circuit thin film transistor TFTg can include a gate electrode GEg, an active layer ACTg, a source electrode SEg and a drain electrode DEg.

The clock signal line CL can be disposed on the gate circuit thin film transistor TFTg.

At least one insulating layer can be disposed between the gate circuit thin film transistor TFTg and the clock signal line CL.

The clock signal line CL can be electrically connected to at least one gate circuit thin film transistor TFTg included in the gate circuit GC through a gate circuit contact hole CHg formed in an insulating layer located under the clock signal line CL.

For example, FIG. 5 illustrates an example that the clock signal line CL is electrically connected to the source electrode SEg of the gate circuit thin film transistor TFTg through the gate circuit contact hole CHg.

As the clock signal line CL is disposed on the gate circuit GC, an area required for an arrangement of the gate driving circuit 120 can be reduced.

And as the clock signal line CL is electrically connected to the gate circuit thin film transistor TFTg included in the gate circuit GC through the gate circuit contact hole CHg formed in the insulating layer located under the clock signal line CL, it can supply a signal necessary for a driving of the gate circuit GC.

Furthermore, by using a material having a low dielectric constant as the insulating layer located under the clock signal line CL, or by disposing the insulting layer having a certain thickness or more, a driving abnormality due to a parasitic capacitance between the clock signal line CL and a circuit element in the gate circuit GC can be prevented.

Figure 6:
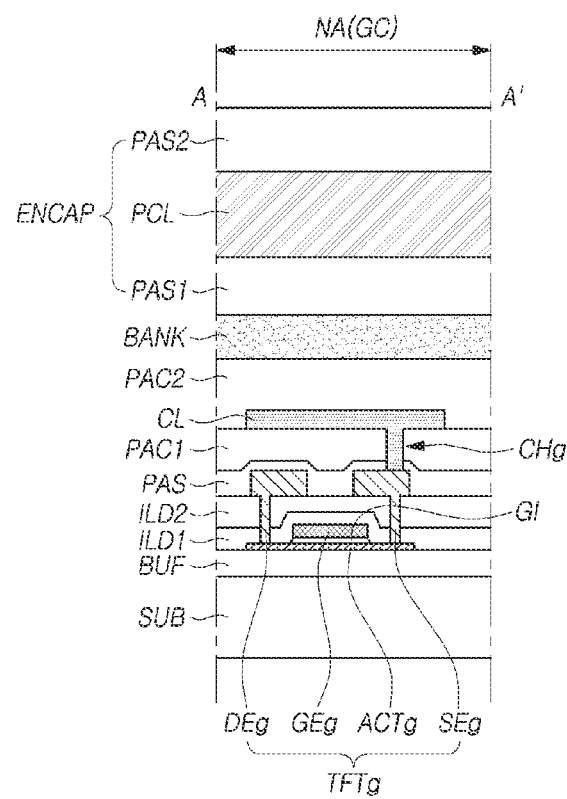
FIG. 6 is a diagram illustrating an example of a cross-sectional structure of a portion cut along line A-A' shown in FIG. 5.

FIG. 6 is a diagram illustrating an example of a cross-sectional structure of a portion cut lone line A-A' shown in FIG. 5. FIG. 6 illustrates an example of a cross-sectional structure of the non-active area NA of the disposed panel 110 where the gate circuit GC is disposed.

Referring to FIG. 6, a buffer layer BUF can be disposed on a substrate SUB.

The active layer ACTg included in the gate circuit thin film transistor TFTg can be disposed on the buffer layer BUF.

A gate insulating layer GI can be disposed on the active layer ACTg. The gate electrode GEg can be disposed on the gate insulating layer GI.

A first interlayer insulating layer ILD1 can be disposed on the gate electrode GEg. A second interlayer insulating layer ILD2 can be disposed on the first interlayer insulating layer ILD1.

The source electrode SEg and the drain electrode DEg can be disposed on the second interlayer insulating layer ILD2. The source electrode SEg and the drain electrode DEg can be electrically connected to conductive portions of the active layer ACTg.

A passivation layer PAS can be disposed on the source electrode SEg and the drain electrode DEg.

A first planarization layer PAC1 can be disposed on the passivation layer PAS. The first planarization layer PAC1 can have a certain thickness. The first planarization layer PAC1 can be a material having a low dielectric constant.

The clock signal line CL can be disposed on the first planarization layer PAC1.

The clock signal line CL can be electrically connected to the source electrode SEg of the gate circuit thin film transistor TFTg through the gate circuit contact hole CHg.

The clock signal line CL can overlap at least a portion of the gate circuit thin film transistor TFTg. For example, the clock signal line CL can overlap the active layer ACTg of the gate circuit thin film transistor TFTg.

The gate line GL which the gate circuit GC outputs the scan signal, for example, can be disposed on a layer where the gate electrode GEg of the gate circuit thin film transistor TFTg is disposed or a layer where the source electrode SEg and the drain electrode DEg are disposed. Thus, the clock signal line CL and the gate line GL can be disposed on different layers.

A second planarization layer PAC2 can be disposed on the clock signal line CL. A bank layer BANK can be disposed on the second planarization layer PAC2.

An encapsulation layer ENCAP for protecting various elements disposed in the display panel 110 from an oxygen and a moisture can be disposed on the bank layer BANK.

The encapsulation layer ENCAP can include a plurality of layers. For example, the encapsulation layer ENCAP can include a first encapsulation layer PAS1, a second encapsulation layer PCL and a third encapsulation layer PAS2. The first encapsulation layer PAS1 and the third encapsulation layer PAS2 can be made of an inorganic material, and the second encapsulation layer PCL can be made of an organic material, but not limited to this.

As described above, by disposing the clock signal line CL on the gate circuit GC, the gate driving circuit 120 can be disposed on the non-active area NA of the display panel 110 while minimizing an increase of the non-active area NA of the display panel 110.

Furthermore, by disposing the first planarization layer PAC1 having a certain thickness and a low dielectric constant between the clock signal line CL and the gate circuit GC, it can be prevented that a parasitic capacitance is formed according to that the clock signal line CL is disposed on the gate circuit GC.

As a structure that the clock signal line CL is disposed on the gate circuit GC is implemented by using a layer disposed on the active area AA, the structure that the clock signal line CL is disposed on the gate circuit GC can be implemented without increasing the number of masks.

Figure 7:
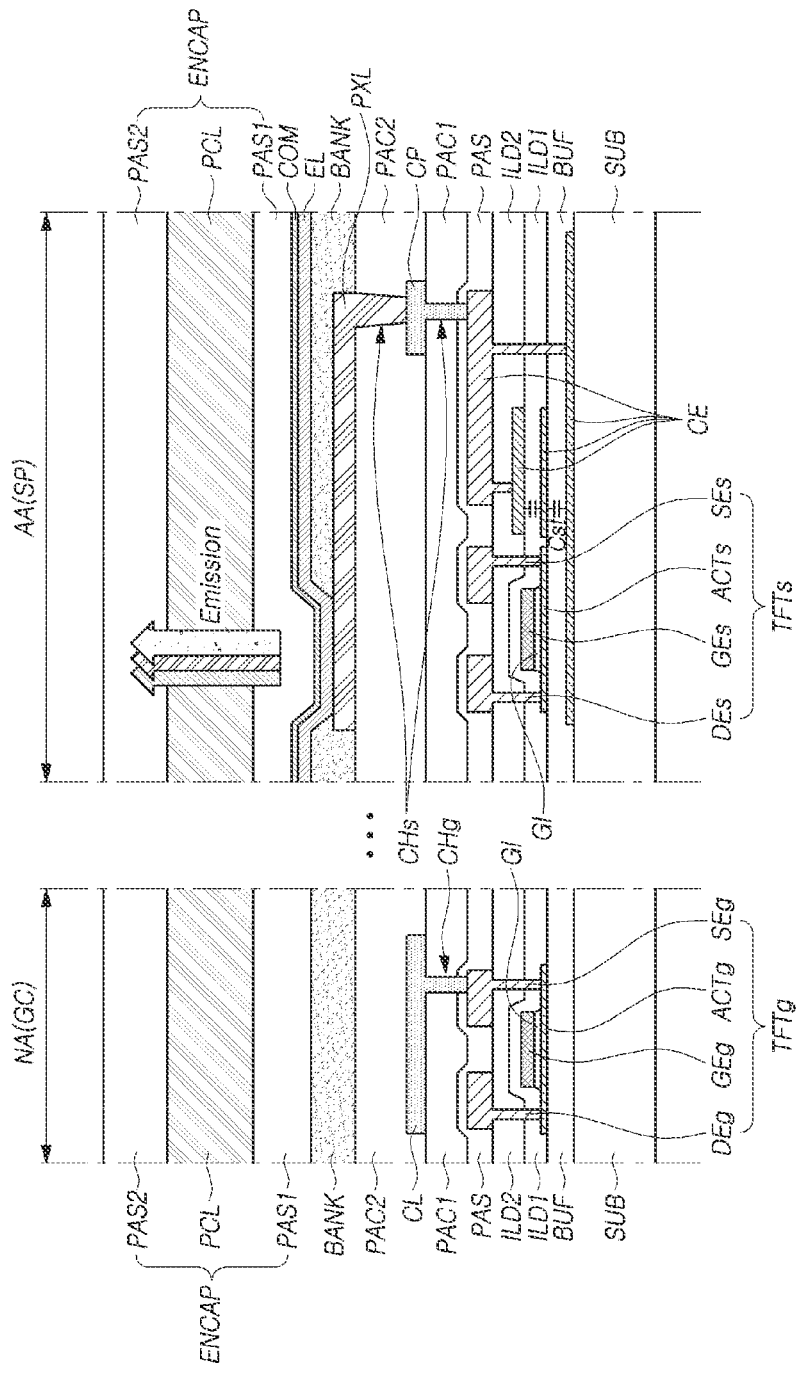
FIG. 7 is a diagram illustrating a comparison of a cross-sectional structure shown in FIG. 6 and a cross-sectional structure of a subpixel.

FIG. 7 is a diagram illustrating a comparison of a cross-sectional structure shown in FIG. 6 and a cross-sectional structure of the subpixel SP.

Referring to FIG. 7, a subpixel thin film transistor TFTs can be disposed on the substrate SUB on the active area AA. The subpixel thin film transistor TFTs can preferably mean one of thin film transistors disposed on the subpixel SP such as the driving transistor DRT above mentioned.

A plurality of capacitor electrode CE forming the storage capacitor Cst can be disposed on the substrate SUB on the active area AA.

The passivation layer PAS can be disposed on the subpixel thin film transistor TFTs and the capacitor electrode CE. The first planarization layer PAC1 can be disposed on the passivation layer PAS.

A connecting pattern CP can be disposed on the first planarization layer PAC1.

The connecting pattern CP can be disposed on a same layer as a layer where the clock signal line CL disposed on the non-active area NA is disposed.

The connecting pattern CP can be electrically connected to the subpixel thin film transistor TFTs or the capacitor electrode CE through a subpixel contact hole CHs formed in the first planarization layer PAC1 and the passivation layer PAS.

The second planarization layer PAC2 can be disposed on the connecting pattern CP.

A pixel electrode PXL can be disposed on the second planarization layer PAC2. The pixel electrode PXL can be electrically connected to the connecting pattern CP through the subpixel contact hole CHs formed in the second planarization layer PAC2. Thus, the pixel electrode PXL can be electrically connected to the subpixel thin film transistor TFTs or the capacitor electrode CE through the connecting pattern CP.

The bank layer BANK can be disposed on a partial area on the pixel electrode PXL.

A light-emitting layer EL and a common electrode COM can be disposed on a partial area on the pixel electrode PXL and the bank layer BANK.

The encapsulation layer ENCAP can be disposed on the common electrode COM.

As implementing the clock signal line CL disposed on the gate circuit GC by using a layer where the connecting pattern CP for connecting the light-emitting element ED disposed on the subpixel SP and the subpixel thin film transistor TFTs is disposed, the clock signal line CL can be disposed on the gate circuit GC without a separate mask.

Furthermore, as the first planarization layer PAC1 located under the connecting pattern CP is disposed under the clock signal line CL, it can be prevented that a parasitic capacitance is formed between the clock signal line CL and the gate circuit GC.

As described above, according to various embodiments of the present disclosure, by disposing the clock signal line CL by using some of layers disposed for a connection between elements in the subpixel SP, the gate driving circuit 120 can be disposed on the non-active area NA of the display panel 110 while minimizing an increase of the non-active area NA of the display panel 110 without an increase of masks.

Furthermore, by implementing the clock signal line CL by using a layer where the pixel electrode PXL is disposed, the clock signal line CL disposed on the gate circuit GC can be implemented while reducing the number of masks further.

Figure 8:
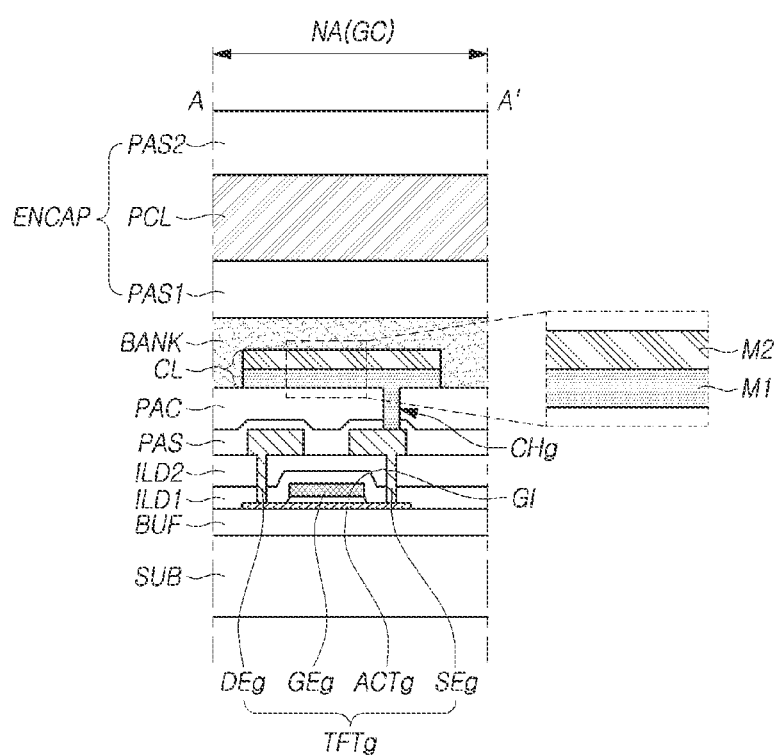
FIG. 8 is a diagram illustrating another example of a cross-sectional structure of a portion cut along line A-A' shown in FIG. 5.

FIG. 8 is a diagram illustrating another example of a cross-sectional structure of a portion cut along line A-A' shown in FIG. 5.

Referring to FIG. 8, the gate circuit thin film transistor TFTg can be disposed on the substrate SUB on the non-active area NA.

The passivation layer PAS and a planarization layer PAC can be disposed on the gate circuit thin film transistor TFTg.

The clock signal line CL can be disposed on the planarization layer PAC.

The bank layer BANK can be disposed on the clock signal line CL.

The bank layer BANK can be disposed to contact an upper surface of the clock signal line CL, and can be disposed to overlap an area where the clock signal line CL is disposed. The encapsulation layer ENCAP can be disposed on the bank layer BANK.

The clock signal line CL disposed between the planarization layer PAC and the bank layer BANK can include at least two or more metal layers.

For example, the clock signal line CL can include a first metal layer M1 and the second metal layer M2.

The second metal layer M2 can be disposed on the first metal layer M1.

An area where the second metal layer M2 is disposed can be same as an area where the first metal layer M1 is disposed. The second metal layer M2 and the first metal layer M1 can be formed through a same mask process.

The first metal layer M1 can have a first resistance, and the second metal layer M2 can have a second resistance greater than the first resistance. The first metal layer M1 can have a first reflectance, and the second metal layer M2 can have a second reflectance greater than the first reflectance.

The first metal layer M1, for example, can be made of a material having a low resistance such as Cu, Mo, Ti, or the like. The first metal layer M1 is not limited to above mentioned examples, can be made of at least one of materials suitable for using as a line.

Furthermore, as the first metal layer M1 includes a hydrogen capture material such as Ti, a hydriding of the active layer ACTg made of an oxide semiconductor can be prevented during a process or the like of the encapsulation layer ENCAP.

The second metal layer M2, for example, can be made of a material having a high reflectance such as Ag or the like, but not limited to this. Alternatively, the second metal layer M2 can be made of several layers including at least one material having a high reflectance. As the second metal layer M2 is made of a material having a high reflectance, it can be used as an electrode of the light-emitting element ED.

As described above, as the clock signal line CL includes a plurality of metal layers, and includes the first metal layer M1 having a low resistance, thus can perform a function of the clock signal line CL.

Furthermore, as the second metal layer M2 having a high reflectance is disposed on the first metal layer M1, the metal layer used for an arrangement of the clock signal line CL can be used as an electrode of the light-emitting element ED in the subpixel SP.

Figure 9:
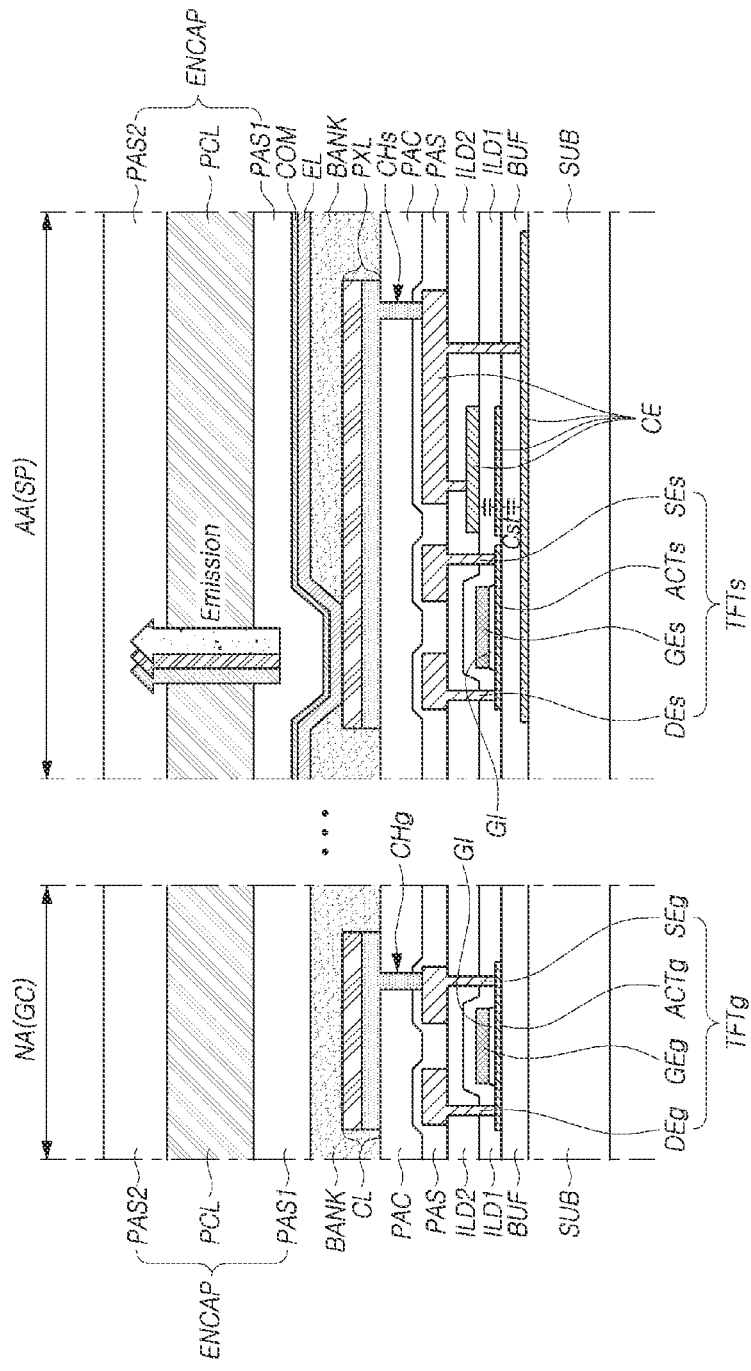
FIG. 9 is a diagram illustrating a comparison of a cross-sectional structure shown in FIG. 8 and a cross-sectional structure of a subpixel.

FIG. 9 is a diagram illustrating a comparison of a cross-sectional structure shown in FIG. 8 and a cross-sectional structure of the subpixel SP.

Referring to FIG. 9, the subpixel thin film transistor TFTs can be disposed on the substrate SUB on the subpixel SP of the active area AA.

A layer where the gate circuit thin film transistor TFTg is disposed can be same as a layer where the subpixel thin film transistor TFTs.

The passivation layer PAS and the planarization layer PAC can be disposed on the subpixel thin film transistor TFTs.

The pixel electrode PXL can be disposed on the planarization layer PAC.

A layer where the pixel electrode PXL is disposed can be same as a layer where the clock signal line CL is disposed.

The pixel electrode PXL can be made of a same material as the clock signal line CL.

The pixel electrode PXL can include the first metal layer M1 and the second metal layer M2 disposed on the first metal layer M1 such as the clock signal line CL.

The bank layer BANK can be disposed on a partial area on the pixel electrode PXL. The light-emitting layer EL and the common electrode COM can be disposed sequentially on a portion where the bank layer BANK is not disposed on the pixel electrode PXL.

As an upper layer of the pixel electrode PXL is made of the second metal layer M2 having a high reflectance, the light-emitting layer EL can be disposed on the second metal layer M2.

As the second metal layer M2 having a high reflectance is disposed under the light-emitting layer EL, the pixel electrode PXL can be implemented by using the metal layer used for disposing the clock signal line CL.

As the first metal layer M1 and the second metal layer M2 used for disposing the clock signal line CL and the pixel electrode PXL can be formed simultaneously, the number of masks can be reduced.

Furthermore, as an arrangement of a separate insulating layer is not required between the clock signal line CL and the pixel electrode PXL since the clock signal line CL and the pixel electrode PXL are disposed on a same layer, the number of masks can be reduced further.

Thus, the clock signal line CL disposed on the gate circuit GC can be implemented on the non-active area NA of the display panel 110, while minimizing the number of masks.

Furthermore, as the first metal layer M1 constituting the pixel electrode PXL is disposed on a same area as an area where the second metal layer M2 is disposed, an area where the first metal layer M1 overlaps the subpixel thin film transistor TFTs can increase.

Thus, the hydriding of the subpixel thin film transistor TFTs during a process can be prevented by a hydrogen capture material included in the first metal layer M1.

According to various embodiments of the present disclosure, by disposing a line supplying a signal or a voltage to the gate circuit GC such as the clock signal line CL on an area overlapping with the gate circuit GC on the gate circuit GC, the gate driving circuit 120 can be disposed on the non-active area NA of the display panel 110 while minimizing an increase of the non-active area NA of the display panel 110.

By implementing the clock signal line CL disposed on the gate circuit GC on the non-active area NA by using a metal disposed on a layer used for implementing a circuit element of the light-emitting element ED or the like on the active area AA, the clock signal line CL disposed on the gate circuit GC can be implemented without an increase of the number of masks.

Furthermore, by implementing the clock signal line CL by using the metal layer which the first metal layer M1 having a low resistance and the second metal layer M2 having a high reflectance are stacked, the pixel electrode PXL can be implemented by using the metal layer used for implementing the clock signal line CL.

Thus, according to various embodiments of the present disclosure, while reducing the number of masks further and minimizing the non-active area NA of the display panel 110, the display device 100 which the gate driving circuit 120 is implemented on the non-active area NA can be provided.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. For example, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device, comprising:
    a plurality of pixel electrodes located in a plurality of subpixels disposed in an active area;
    a gate driving circuit disposed in a non-active area located outside of the active area, and configured to output a scan signal to the plurality of subpixels, the gate driving circuit including an active layer, a gate electrode disposed above the active layer, and a source electrode and a drain electrode both disposed above the active layer; and
    at least one signal line disposed in the non-active area, and disposed directly above and contacting a same layer either as a layer directly above which the plurality of pixel electrodes are disposed and contact, or as a layer directly above which a connection pattern electrically connected to one of the pixel electrodes is disposed and contacts,
    wherein the at least one signal line is configured to supply a signal to one of the source and drain electrodes of the gate driving circuit.

2. The display device of claim 1, wherein the at least one signal line is located above the gate driving circuit, and at least a portion of the at least one signal line is located above an area overlapping with the gate driving circuit.

3. The display device of claim 1, wherein the at least one signal line is made of a same material as the plurality of pixel electrodes.

4. The display device of claim 1, wherein each of the at least one signal line and the plurality of pixel electrodes comprises two or more metal layers.

5. The display device of claim 1, wherein the at least one signal line comprises:
    a first metal layer having a first resistance and a first reflectance; and
    a second metal layer disposed above the first metal layer, having a second resistance greater than the first resistance, and having a second reflectance greater than the first reflectance.

6. The display device of claim 5, wherein an area where the first metal layer is disposed and an area where the second metal layer is disposed are the same.

7. The display device of claim 5, wherein the first metal layer comprises a hydrogen capture material.

8. The display device of claim 1, further comprising:
a planarization layer located under the at least one signal line.

9. The display device of claim 8, wherein the at least one signal line is electrically connected to at least one of a plurality of thin film transistors included in the gate driving circuit through a contact hole included in the planarization layer.

10. The display device of claim 8, wherein each of the plurality of pixel electrodes is electrically connected to at least one thin film transistor included in each of the plurality of subpixels through a contact hole included in the planarization layer.

11. The display device of claim 1, further comprising:
a bank layer located above an upper surface of the at least one signal line, and disposed in an area including an area overlapping with the at least one signal line.

12. The display device of claim 1, wherein the at least one signal line includes at least one of a clock signal line, a gate high voltage line, and a gate low voltage line.

13. A display device, comprising:
a plurality of subpixels disposed in an active area, and configured to display an image;
a plurality of gate lines disposed in the active area and configured to supply a scan signal to the plurality of subpixels;
a gate driving circuit disposed in a non-active area located outside of the active area, and configured to output the scan signal to the plurality of gate lines, the gate driving circuit including an active layer, a gate electrode disposed above the active layer, and a source electrode and a drain electrode both disposed above the active layer; and
at least one signal line disposed in the non-active area, and located above and overlapping the source and drain electrodes of the gate driving circuit,
wherein the at least one signal line is configured to supply a signal to the gate driving circuit.

14. The display device of claim 13, wherein the at least one signal line comprises:
a first metal layer; and
a second metal layer disposed above an area overlapping with the first metal layer above the first metal layer,
wherein at least one of a resistance and a reflectance of the second metal layer is different from at least one of a resistance and a reflectance of the first metal layer.

15. The display device of claim 13, wherein the at least one signal line is disposed above a same layer as a layer where a pixel electrode located in each of a plurality of subpixels disposed in the active area is disposed.

16. The display device of claim 13, further comprising:
a planarization layer located between the gate driving circuit and the at least one signal line; and
a bank layer located above an upper surface of the at least one signal line.

17. The display device of claim 16, wherein the at least one signal line is electrically connected to at least one thin film transistor included in the gate driving circuit through a contact hole included in the planarization layer.

18. The display device of claim 17, wherein at least a portion of the at least one signal line overlaps an active layer of the at least one thin film transistor.

19. The display device of claim 13, wherein the plurality of gate lines are disposed above a different layer from a layer where the at least one signal line is disposed.

20. The display device of claim 13, wherein the at least one signal line includes at least one of a clock signal line, a gate high voltage line, and a gate low voltage line.

21. A display device, comprising:
a display panel where a plurality of gate lines, a plurality of data lines and a plurality of subpixels are disposed;
a gate driving circuit disposed in a non-active area, and configured to output a scan signal to the plurality of gate lines, the gate driving circuit including an active layer, a gate electrode disposed above the active layer, and a source electrode and a drain electrode both disposed above the active layer;
a planarization layer covering the source and drain electrodes of the gate driving circuit;
at least one signal line disposed in the non-active area, located above and overlapping the source and drain electrodes of the gate driving circuit, and configured to supply a signal to the gate driving circuit; and
a plurality of pixel electrodes located in the plurality of subpixels,
wherein the at least one signal line and one of the plurality of pixel electrodes are disposed directly above and contact the planarization layer, and
wherein the plurality of pixel electrodes comprise a first metal layer having a first reflectance and a second metal layer located above the first metal layer and having a second reflectance greater than the first reflectance.

22. The display device of claim 21, wherein the at least one signal line includes same first and second metal layers as the first and second metal layers of the plurality of pixel electrodes.

23. The display device of claim 21, wherein the at least one signal line includes at least one of a clock signal line, a gate high voltage line, and a gate low voltage line.

* * * * *